United States Patent
Theuss

(10) Patent No.: US 8,559,139 B2
(45) Date of Patent: Oct. 15, 2013

(54) SENSOR MODULE AND METHOD FOR MANUFACTURING A SENSOR MODULE

(75) Inventor: Horst Theuss, Wenzenbach (DE)

(73) Assignee: Intel Mobile Communications GmbH, Neubiberg (DE)

( * ) Notice: Subject to any disclaimer, the term of this patent is extended or adjusted under 35 U.S.C. 154(b) by 854 days.

(21) Appl. No.: 11/956,971

(22) Filed: Dec. 14, 2007

(65) Prior Publication Data
US 2009/0153138 A1    Jun. 18, 2009

(51) Int. Cl.
G11B 5/39    (2006.01)
(52) U.S. Cl.
USPC .......................................................... 360/313
(58) Field of Classification Search
USPC .............................. 360/234.5, 317
See application file for complete search history.

(56) References Cited

U.S. PATENT DOCUMENTS

| | | | |
|---|---|---|---|
| 5,521,501 | A | 5/1996 | Dettmann et al. |
| 6,069,476 | A | 5/2000 | Vieux-Rochaz et al. |
| 6,882,146 | B2 | 4/2005 | Maiwald |
| 6,987,312 | B2 | 1/2006 | Theuss |
| 7,030,601 | B2 | 4/2006 | Buchhold |
| 7,056,764 | B2 | 6/2006 | Auburger et al. |
| 7,061,098 | B2 | 6/2006 | Meckes et al. |
| 7,208,944 | B2 | 4/2007 | Tatschl et al. |
| 7,231,325 | B2 | 6/2007 | Motz et al. |
| 2002/0024109 | A1 | 2/2002 | Hayat-Dawoodi |
| 2002/0145833 | A1* | 10/2002 | Shiroishi ....................... 360/317 |
| 2003/0067721 | A1* | 4/2003 | Hsiao et al. .................... 360/317 |
| 2003/0206373 | A1* | 11/2003 | Kato et al. ................. 360/234.5 |
| 2005/0278136 | A1 | 12/2005 | Werth |
| 2006/0131712 | A1 | 6/2006 | Jerebic et al. |
| 2006/0202692 | A1 | 9/2006 | Tatschl et al. |
| 2007/0069354 | A1 | 3/2007 | Dangelmaier et al. |
| 2007/0097550 | A1* | 5/2007 | Yamaguchi et al. ........ 360/234.5 |
| 2007/0115588 | A1* | 5/2007 | Amemiya et al. .......... 360/234.5 |
| 2007/0145972 | A1 | 6/2007 | Auburger et al. |
| 2007/0164734 | A1 | 7/2007 | Shimizu et al. |
| 2007/0177305 | A1* | 8/2007 | Araki et al. ................. 360/234.5 |
| 2007/0182029 | A1 | 8/2007 | Franosch et al. |
| 2007/0201165 | A1* | 8/2007 | Kato et al. .................. 360/234.5 |
| 2007/0222005 | A1 | 9/2007 | Schmitt |
| 2007/0230056 | A1* | 10/2007 | Beach et al. ................ 360/234.5 |
| 2008/0074790 | A1* | 3/2008 | Kobayashi .................. 360/234.5 |

(Continued)

FOREIGN PATENT DOCUMENTS

| CA | 2083008 | 5/1993 |
|---|---|---|
| DE | 4121374 | 1/1993 |

(Continued)

OTHER PUBLICATIONS

Infineon Technologies, Data Book entitled "6.6 Application Notes: Differential Hall IC TLE 4921-3U," Jul. 2000; pp. 31-51.

(Continued)

*Primary Examiner* — Mark Blouin
(74) *Attorney, Agent, or Firm* — SpryIP, LLC

(57) ABSTRACT

A method of manufacturing a sensor module includes providing a substrate comprising an array of magnetically sensitive elements on a first main face of the substrate. An array of conducting lines is applied over the first main face of the substrate. An array of electrical interconnects is applied over the first main face of the substrate. The substrate is singulated after application of the electrical interconnects.

20 Claims, 8 Drawing Sheets

(56) References Cited

U.S. PATENT DOCUMENTS

| | | | |
|---|---|---|---|
| 2008/0088975 A1* | 4/2008 | Bennin et al. | 360/234.5 |
| 2008/0094753 A1* | 4/2008 | Brodkin et al. | 360/234.5 |
| 2008/0170326 A1* | 7/2008 | Feng et al. | 360/99.04 |

FOREIGN PATENT DOCUMENTS

| | | |
|---|---|---|
| DE | 4319146 | 12/1994 |
| DE | 195 20 206 | 12/1996 |
| DE | 102 20 911 | 12/2003 |
| DE | 102005047413 | 9/2006 |
| WO | 98/48291 | 10/1998 |

OTHER PUBLICATIONS

M. Brunnbauer et al., article from 2006 Electronics Packaging Technology Conference entitled Embedded Wafer Level Ball rid Array (eWLB); 5 pgs.; © 2006.

Infineon Technologies, Target Data Sheet entitled "TLE 5011 GMR Based Angular Sensor," V.01, Apr. 2007; 56 pgs.

Infineon Technologies, Preliminary Data Sheet entitled "TLE 5010 GMR Based Angular Sensor," V.09, May 2007; 56 pgs.

U.S. Appl. No. 11/868,845, filed Oct. 8, 2007, and entitled "Magnetic Sensor Integrated Circuit with Test Conductor".

\* cited by examiner

US 8,559,139 B2

SENSOR MODULE AND METHOD FOR MANUFACTURING A SENSOR MODULE

BACKGROUND

Some magnetic speed sensors are configured to measure the speed of a magnetic tooth wheel. Such speed sensors typically include an integrated circuit with a plurality of magnetic sensor elements, such as Hall sensor elements or xMR sensor elements (e.g., GMR—giant magneto resistance; AMR—anisotropic magneto resistance; TMR—tunnel magneto resistance; CMR—colossal magneto resistance). A permanent magnet provides a bias magnetic field to the sensor elements. As the wheel is rotated, the teeth of the wheel pass in front of the sensor and generate a small field variation, which is detected by the integrated circuit. The detected field contains information about the angular position and rotational speed of the wheel. Another type of magnetic sensor is a magnetic switch (e.g., a Hall switch), which can be used, for example, in a folding mobile phone to determine if the mobile phone is open or closed.

It is desirable to be able to test magnetic sensors to help ensure that the sensors are operating properly. One method for testing a magnetic sensor is to use an external magnetic core to apply test magnetic fields to the sensor, and measure the sensor response. In addition to the expense of the external equipment, another problem with using such an external magnetic field source is that there must be a precise alignment between the magnetic core and the sensor under test. Position errors can result in inaccurate test results.

SUMMARY

One embodiment provides a method of manufacturing a sensor module. The method includes providing a substrate comprising an array of magnetically sensitive elements on a first main face of the substrate. An array of conducting lines is applied over the first main face of the substrate. An array of electrical interconnects is applied over the first main face of the substrate. The substrate is singulated after application of the electrical interconnects.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is desirable to be able to test magnetic sensors to help ensure that the sensors are operating properly. One embodiment provides a magnetic sensor module (e.g., integrated circuit) that includes at least one conductor integrated on-chip to generate magnetic fields during a test mode of the module. The magnetic fields applied to the magnetic sensor during the test mode are used to test the functionality of the sensor.

Figure 1A:
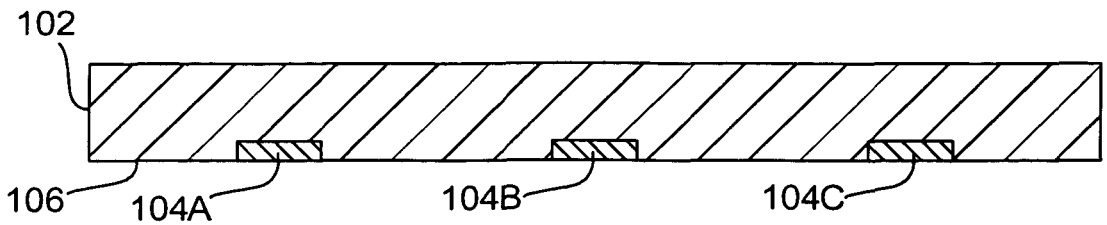
FIGS. 1A-1D are diagrams illustrating a method of manufacturing a sensor module according to one embodiment.
Figure 1B:
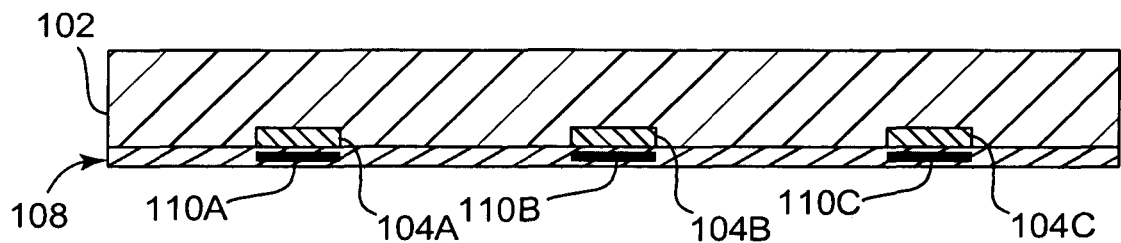
Figure 1C:
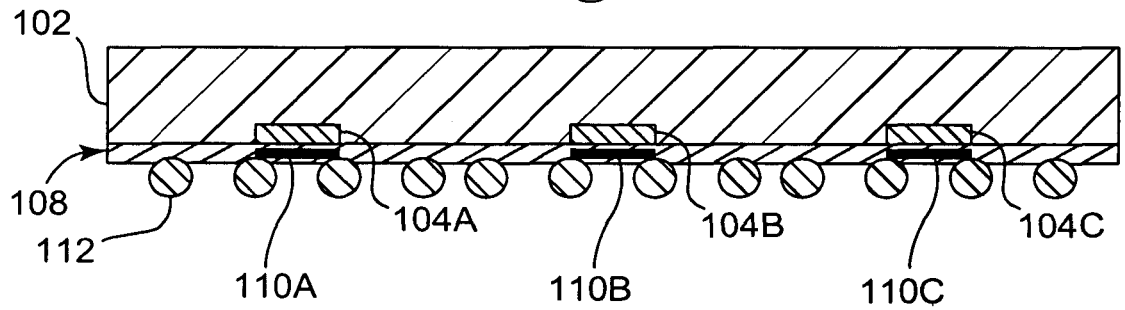
Figure 1D:
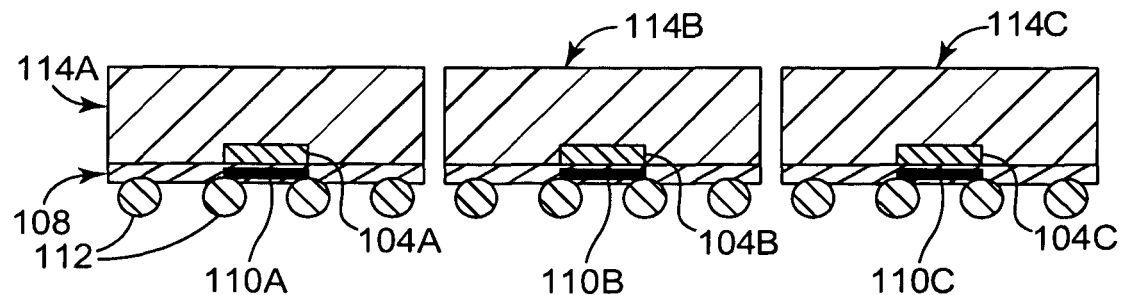

FIGS. 1A-1D are diagrams illustrating a method of manufacturing a sensor module according to one embodiment. As shown in FIG. 1A, a substrate 102 is provided, which comprises an array of magnetically sensitive elements 104A-104C on a first main face 106 of the substrate 102. As shown in FIG. 1B, an element 108 with an array of conducting lines 110A-110C is applied over the first main face 106 of the substrate 102. As shown in FIG. 1C, an array of electrical interconnects 112 is applied over the first main face 106 of the substrate 102. As shown in FIG. 1D, the substrate 102 is singulated after application of the electrical interconnects 112, thereby forming a plurality of separate sensor modules 114A-114C. In one embodiment, electrical interconnects 112 are solder elements. In another embodiment, electrical interconnects 112 are made out of Au, Cu, Ni, AuSn, or CuSn. In yet another embodiment, electrical interconnects 112 are Cu or Au studs covered with a Sn cap.

In one embodiment, the substrate 102 comprises a semiconductor wafer, such as a silicon wafer. In another embodiment, the substrate 102 comprises a polymer wafer comprising an array of semiconductor dies, and the magnetically sensitive elements 104A-104C are integrated into the array of dies. In one embodiment, the conducting lines 110A-110C are each configured to generate a magnetic field for testing the magnetically sensitive elements 104A-104C, respectively.

In operation according to one embodiment, a voltage is applied to, or a current is injected into, a supply solder element 112 connected to one of the conducting lines 110A-110C during a test mode of the sensor module (e.g., sensor module 114A), causing a current to flow through the conducting line to a ground solder element 112, which is also connected to the conducting line. The conducting line generates a magnetic field that is applied to the magnetically sensitive element. In one embodiment, the sensor module processes the signals generated by the magnetically sensitive element in the test mode in a normal manner (i.e., in the same manner that the signals are processed in a normal mode of operation), and generates corresponding output signals.

Figure 2A:
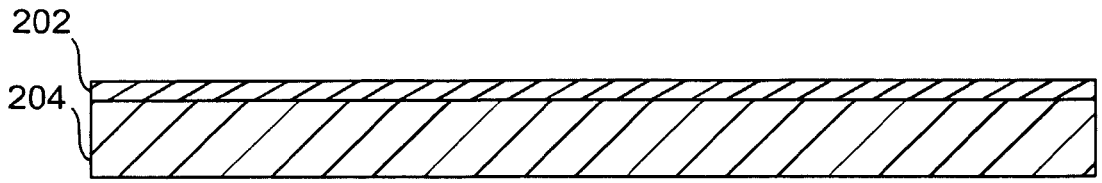
FIGS. 2A-2H are diagrams illustrating a method of manufacturing a sensor module according to another embodiment.
Figure 2B:
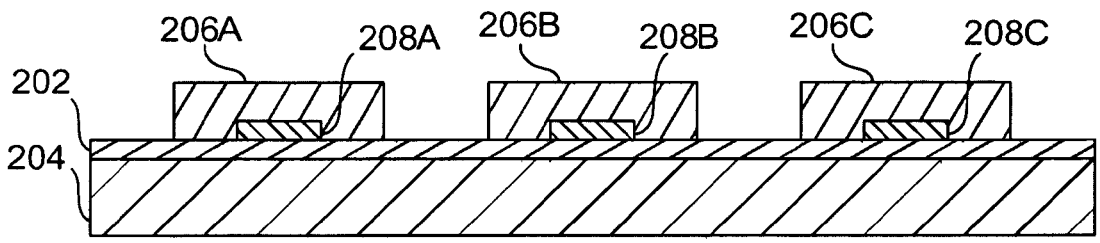
Figure 2C:
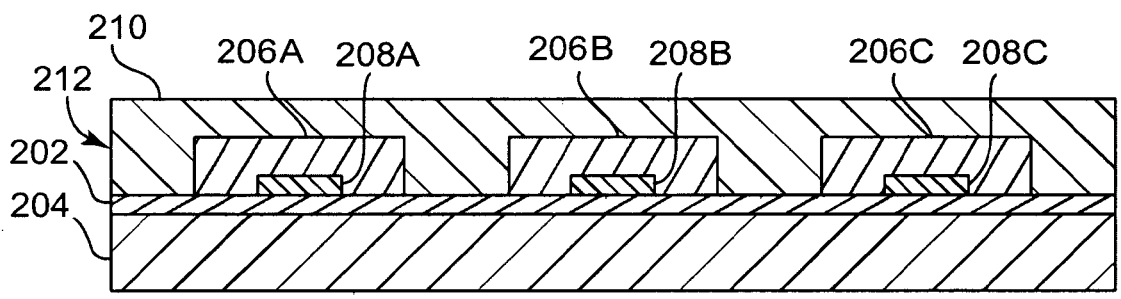

FIGS. 2A-2H are diagrams illustrating a method of manufacturing a sensor module according to another embodiment. As shown in FIG. 2A, a carrier plate 204 is provided, and a double-sided sticky tape 202 is laminated on the carrier plate 204. In one embodiment, the carrier plate 204 is a metal plate. As shown in FIG. 2B, a plurality of semiconductor dies 206A-206C is applied to the tape 202. In one embodiment, a pick-and-place process is used to take individual semiconductor dies from a singulated semiconductor wafer, and place the dies on the tape 202, with the active areas of the semiconductor dies facing the tape 202. The semiconductor dies 206A-206C include magnetically sensitive elements 208A-208C, respectively. As shown in FIG. 2C, a mold layer 210 is applied over the semiconductor dies 206A-206C and the tape 202, thereby encapsulating the semiconductor dies 206A-206C. In one embodiment, the mold layer 210 comprises a polymer. The combination of the semiconductor dies 206A-206C and the mold layer 210 according to one embodiment is referred to herein as a molded reconfigured wafer 212. In one embodiment, the reconfigured wafer 212 has the same geometry and dimensions as a standard silicon wafer, such as a 200 mm silicon wafer.

Figure 2D:
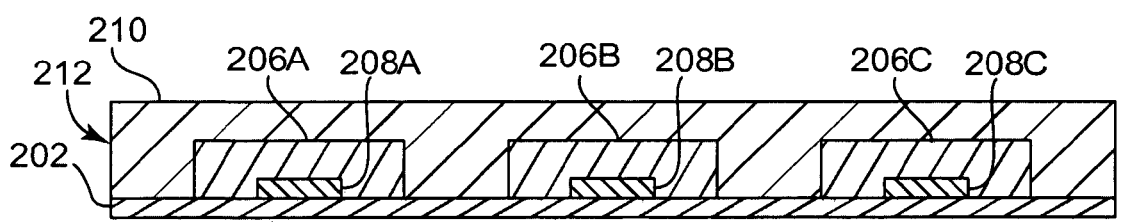
Figure 2E:
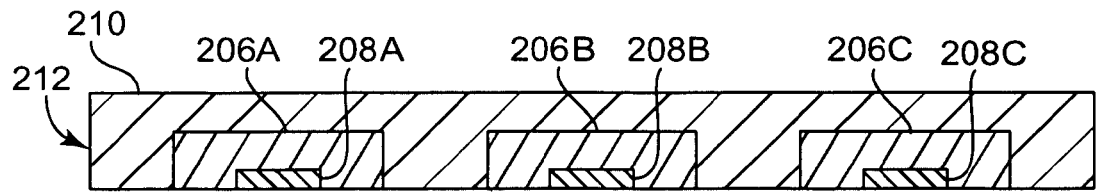
Figure 2F:
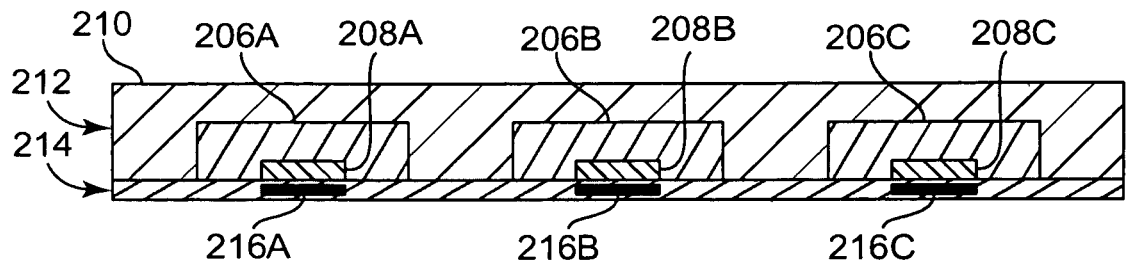
Figure 2G:
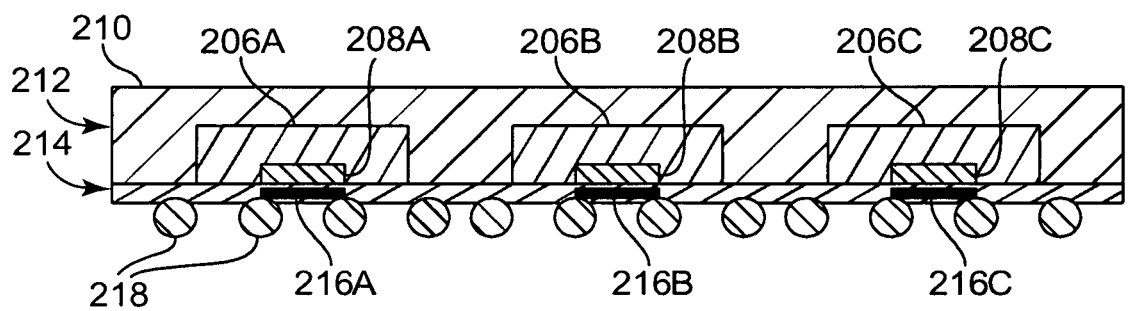
Figure 2H:
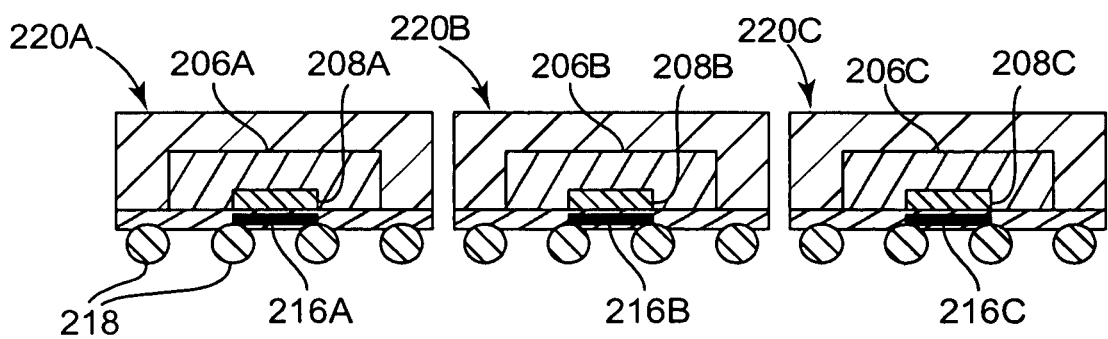

As shown in FIG. 2D, the carrier plate 204 is removed from the tape 202, and as shown in FIG. 2E, the tape 202 is removed from the reconfigured wafer 212. As shown in FIG. 2F, an element 214 with an array of conducting lines 216A-216C is applied on the reconfigured wafer 212. As shown in FIG. 2G, an array of solder elements (e.g., solder balls) 218 is applied on the element 214. In one embodiment, at least two of the solder elements 218 are applied to each of the conducting lines 216A-216C. As shown in FIG. 2H, the reconfigured wafer 212 with the solder balls 218 formed thereon is singulated into a plurality of individual sensor modules 220A-220C.

In operation according to one embodiment, a voltage is applied to, or a current is injected into, a supply solder element 218 connected to one of the conducting lines 216A-216C during a test mode of the sensor module (e.g., sensor module 220A), causing a current to flow through the conducting line to a ground solder element 218, which is also connected to the conducting line. The conducting line generates a magnetic field that is applied to the magnetically sensitive element. In one embodiment, the sensor module processes the signals generated by the magnetically sensitive element in the test mode in a normal manner (i.e., in the same manner that the signals are processed in a normal mode of operation), and generates corresponding output signals.

Figure 3:
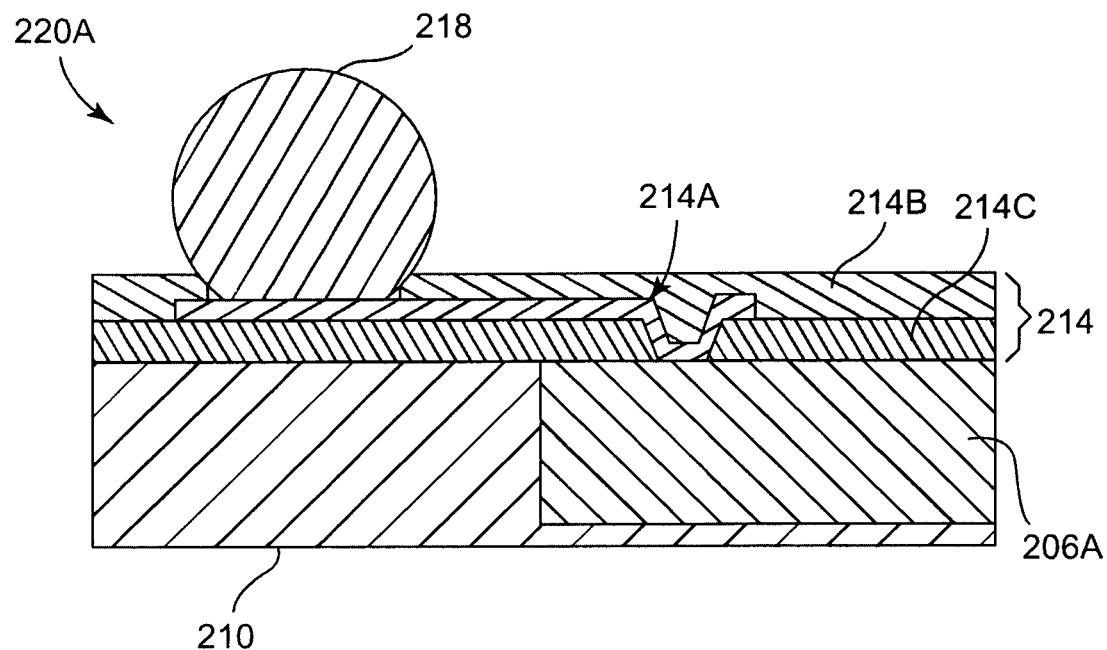
FIG. 3 is a diagram illustrating a portion of one of the sensor modules (shown in FIG. 2H) in additional detail according to one embodiment.

FIG. 3 is a diagram illustrating a portion of one of the sensor modules 220A (shown in FIG. 2H) in additional detail according to one embodiment. As shown in FIG. 3, element 214 is formed on mold layer 210 and die 206A. In one embodiment, element 214 is a redistribution layer (RDL) structure that includes a plurality of insulation layers, such as polymer layers, and at least one metal layer (e.g., a metal layer sandwiched between two insulation layers). In the illustrated embodiment, element 214 includes a metal layer 214A sandwiched between two insulation layers 214B and 214C. The individual layers 214A-214C of the RDL structure are applied in a sequential manner to the reconfigured wafer 212. In another embodiment, element 214 is a laminate that is pre-formed prior to being applied to the reconfigured wafer 212. Solder ball 218 is connected to metal layer 214A through a hole in insulation layer 214B. Metal layer 214A is connected to a die pad on die 206A through a hole in insulating layer 214C. In one embodiment, element 108 (FIGS. 1B-1D) is formed in the same manner and has the same structure as element 214. In one embodiment, conductors 110A-110C (FIGS. 1B-1D) and conductors 216A-216C (FIGS. 2F-2H) are implemented in the metal layer 214A.

Figure 4:
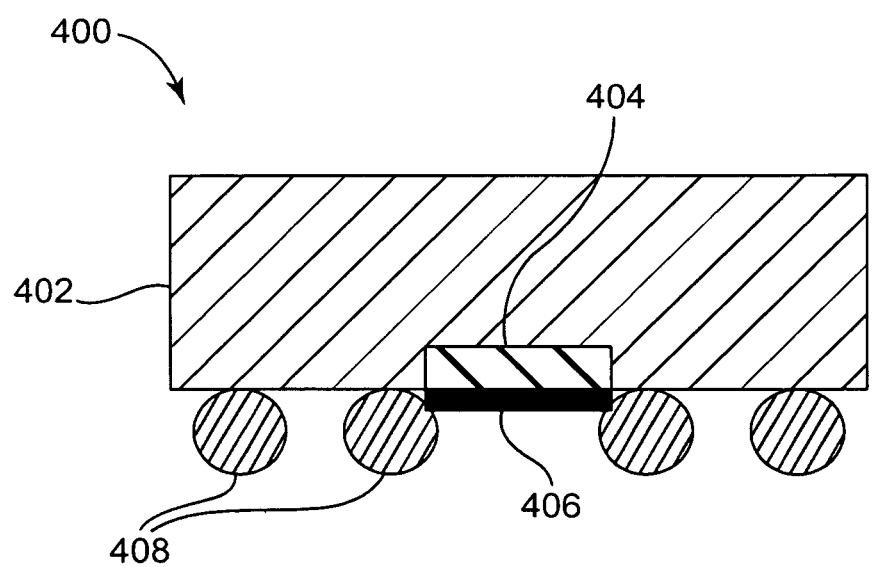
FIG. 4 is a diagram illustrating a sensor module according to another embodiment.

FIG. 4 is a diagram illustrating a sensor module 400 according to another embodiment. Sensor module 400 includes a substrate 402 comprising a magnetically sensitive element 404. In one embodiment, substrate 402 is a semiconductor die. In the illustrated embodiment, four solder elements 408 are applied to the substrate 402. In another embodiment, more or less than four solder elements 408 may be used. A conducting line 406 connects two of the solder elements 408. In another embodiment, conducting line 406 connects more than two of the solder elements 408.

In operation according to one embodiment, a voltage is applied to, or a current is injected into, a supply solder element 408 connected to the conducting line 406 during a test mode of the sensor module 400, causing a current to flow through the conducting line to a ground solder element 408, which is also connected to the conducting line 406. The conducting line 406 generates a magnetic field that is applied to the magnetically sensitive element 404. In one embodiment, the sensor module 400 processes the signals generated by the magnetically sensitive element 404 in the test mode in a normal manner (i.e., in the same manner that the signals are processed in a normal mode of operation), and generates corresponding output signals.

Figure 5:
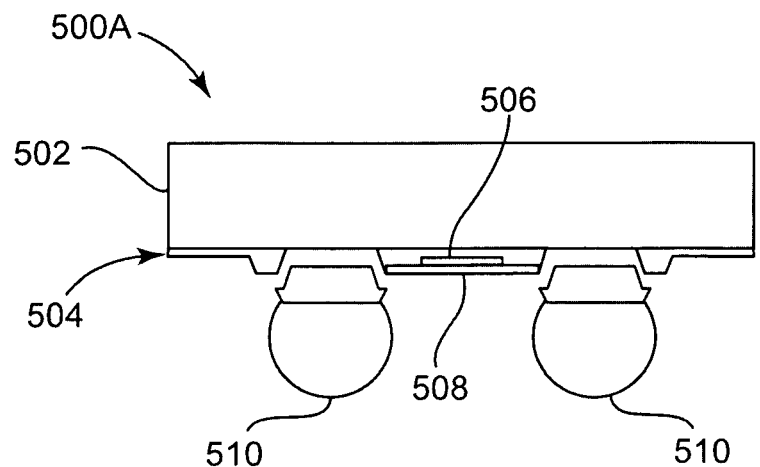
FIG. 5 is a diagram illustrating a cross-sectional view of a sensor module according to another embodiment.

FIG. 5 is a diagram illustrating a cross-sectional view of a sensor module 500A according to another embodiment. Sensor module 500A includes an insulation layer 504 formed on a semiconductor die 502. In one embodiment, insulation layer 504 comprises a polymer layer. A magnetically sensitive element 506 is formed on or in the insulation layer 504, and a plurality of conductors 508 is formed on or in the insulation layer 504. In one embodiment, the insulation layer 504 is applied over the semiconductor die 502 prior to applying the conductors 508. A plurality of solder elements 510 are configured to be inserted through holes in the insulation layer 504, and connected to die pads of the die 502. In the illustrated embodiment, the solder elements 510 are solder balls.

Figure 6:
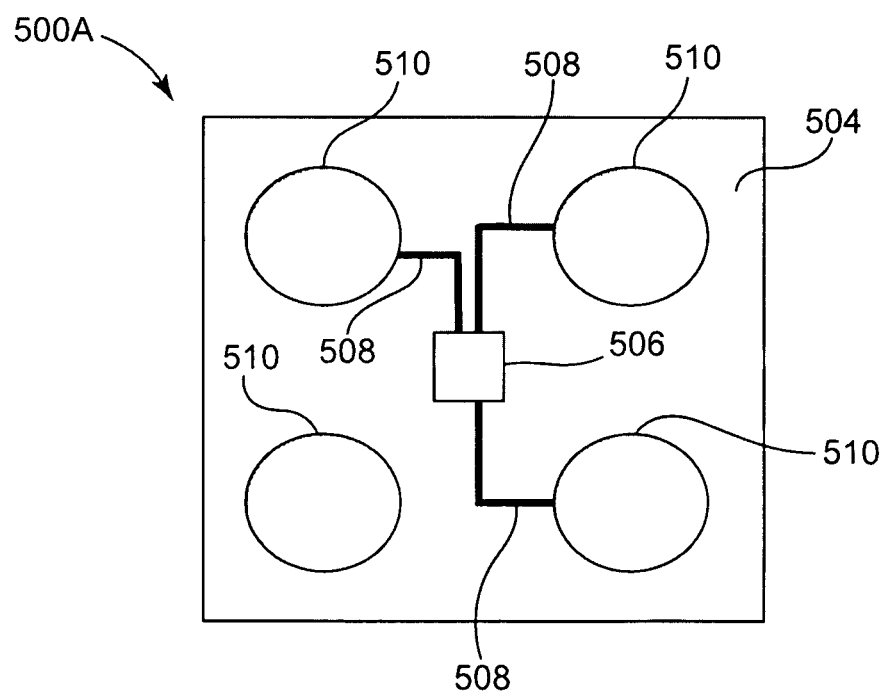
FIG. 6 is a diagram illustrating a bottom view of the sensor module shown in FIG. 5 according to one embodiment.

FIG. 6 is a diagram illustrating a bottom view of the sensor module 500A shown in FIG. 5 according to one embodiment. As shown in FIG. 6, the sensor module 500A includes four solder balls 510. The magnetically sensitive element 506 is coupled to three of the solder balls 510 (e.g., solder balls 510 for a supply, a ground, and an output connection) via conductors 508. The fourth solder ball 510 is not electrically connected to anything in the illustrated embodiment, but rather is provided for stability purposes. In one embodiment, sensor module 500A is a Hall switch. In one embodiment, sensor module 500A has a cross-sectional area of 2 mm by 2 mm or smaller.

Figure 7:
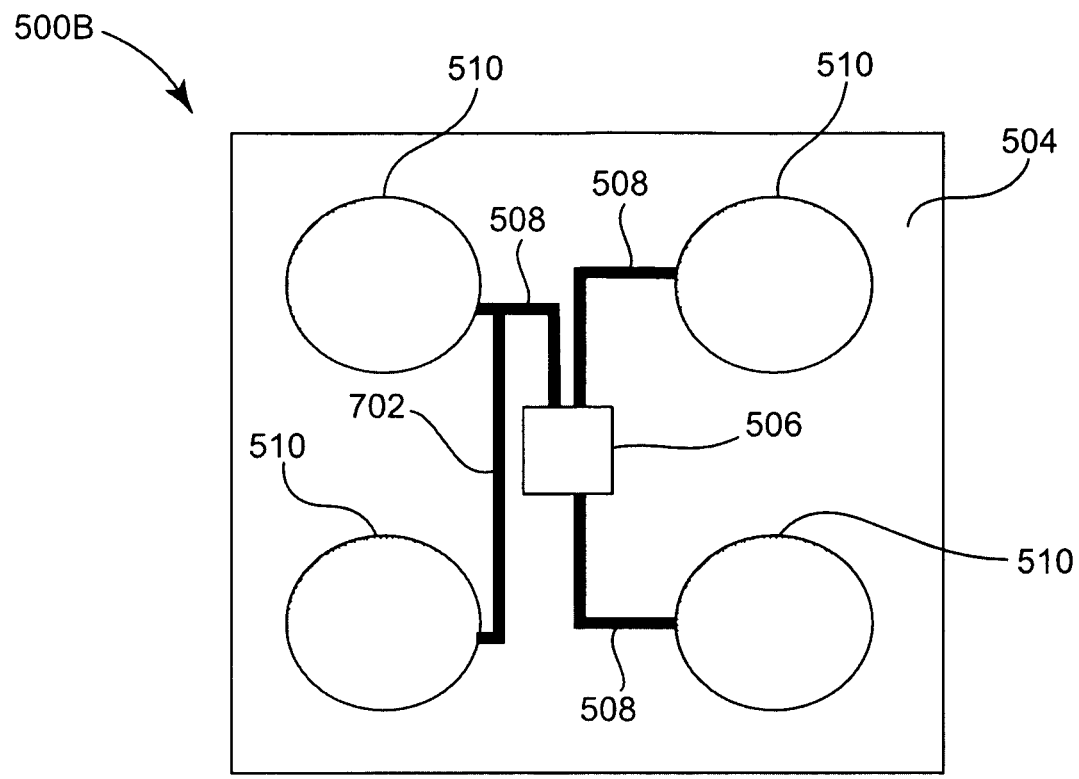
FIG. 7 is a diagram illustrating a bottom view of the sensor module shown in FIG. 5 with the addition of a test conductor according to one embodiment.

FIG. 7 is a diagram illustrating a bottom view of the sensor module 500A shown in FIG. 5 with the addition of a test conductor 702 according to one embodiment. The embodiment of the sensor module shown in FIG. 7, which includes the conductor 702, is represented by reference number 500B. In one embodiment, the conductor 702 is formed on or in the insulation layer 504.

Figure 8:
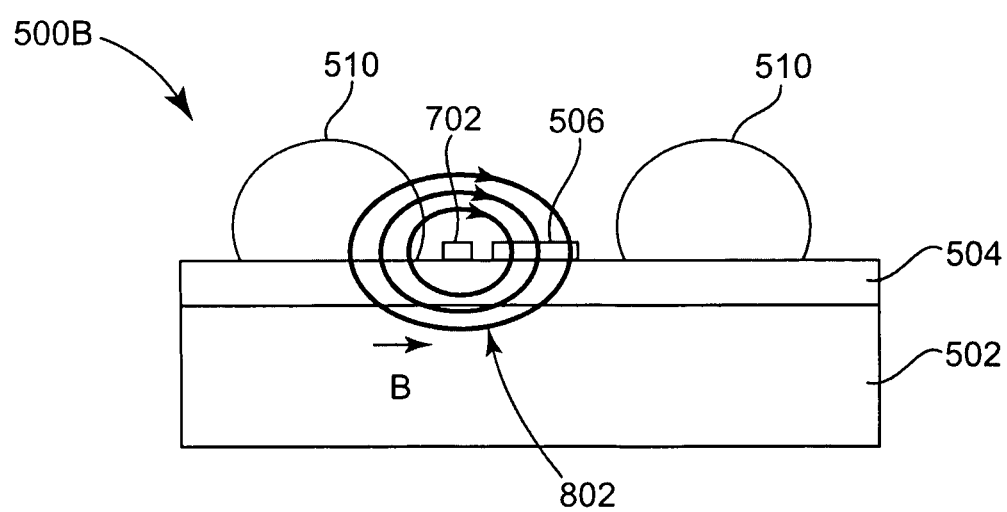
FIG. 8 is a diagram illustrating a side view of the sensor module shown in FIG. 7 and the generation of a magnetic field with the test conductor according to one embodiment.

FIG. 8 is a diagram illustrating a side view of the sensor module 500B shown in FIG. 7 and the generation of a magnetic field with the test conductor 702 according to one embodiment. As shown in FIG. 8, when a current flows through the conductor 702, a magnetic field and a magnetic induction (B) 802 is generated, which penetrates the magnetically sensitive element 506 in a perpendicular direction (e.g., perpendicular to the plane of the die 502). An estimate of the magnitude of the magnetic induction is given by the following Equation I:

$$B = \mu_0 I / 2\pi r \quad \text{Equation I}$$

Where:
B=magnetic induction;
$\mu_0$=permeability of a vacuum;
I=current through the conductor 702; and
r=distance from the conductor 702.

For a current, I, of 30 mA, through the conductor 702, and a distance, r, of 30 μm, between the conductor 702 and the magnetically sensitive element 506, a magnetic induction, B, of about 0.2 mT through the magnetically sensitive element 506 is generated. Higher currents and magnetic inductions can be generated with a thicker conductor 702. Decreasing the distance between the conductor 702 and the magnetically sensitive element 506 also increases the magnetic field at the location of the element 506.

Figure 9:
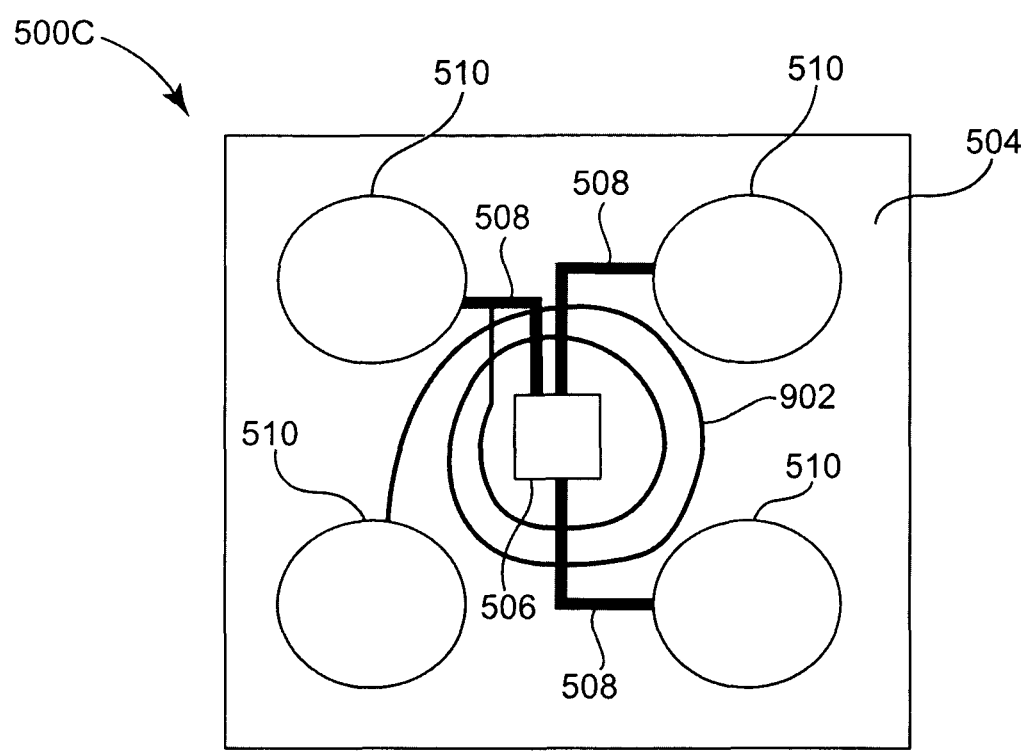
FIG. 9 is a diagram illustrating a bottom view of the sensor module shown in FIG. 5 with the addition of a test conductor coil according to one embodiment.

FIG. 9 is a diagram illustrating a bottom view of the sensor module 500A shown in FIG. 5 with the addition of a test conductor coil 902 according to one embodiment. The embodiment of the sensor module shown in FIG. 9, which includes the conductor 902, is represented by reference number 500C. In one embodiment, the conductor 902 is formed on or in the insulation layer 504. In the illustrated embodiment, conductor 902 is a coil (e.g., spiral-shaped) with a plurality of turns or windings, and the conductor 902 surrounds the magnetically sensitive element 506. In one embodiment, the conductor coil 902 is implemented with multiple metal layers.

In one embodiment, the sensor modules 500A, 500B, and 500C are each chip-size packages that are made using wafer-level packaging, wherein singulation occurs after application of the solder balls 510. In operation according to one embodiment, a voltage is applied to, or a current is injected into, a supply solder element 510 connected to the conductor 702 or 902 during a test mode of the sensor module 500B or 500C, causing a current to flow through the conductor 702 or 902 to a ground solder element 510, which is also connected to the conductor 702 or 902. The conductor 702 or 902 generates a magnetic field that is applied to the magnetically sensitive element 506. In one embodiment, the sensor modules 500B and 500C process the signals generated by the magnetically sensitive element 506 in the test mode in a normal manner (i.e., in the same manner that the signals are processed in a normal mode of operation), and generate corresponding output signals. The conductor coil 902 according to one embodiment generates a larger magnetic field than a straight-line conductor, such as conductor 702.

Figure 10:
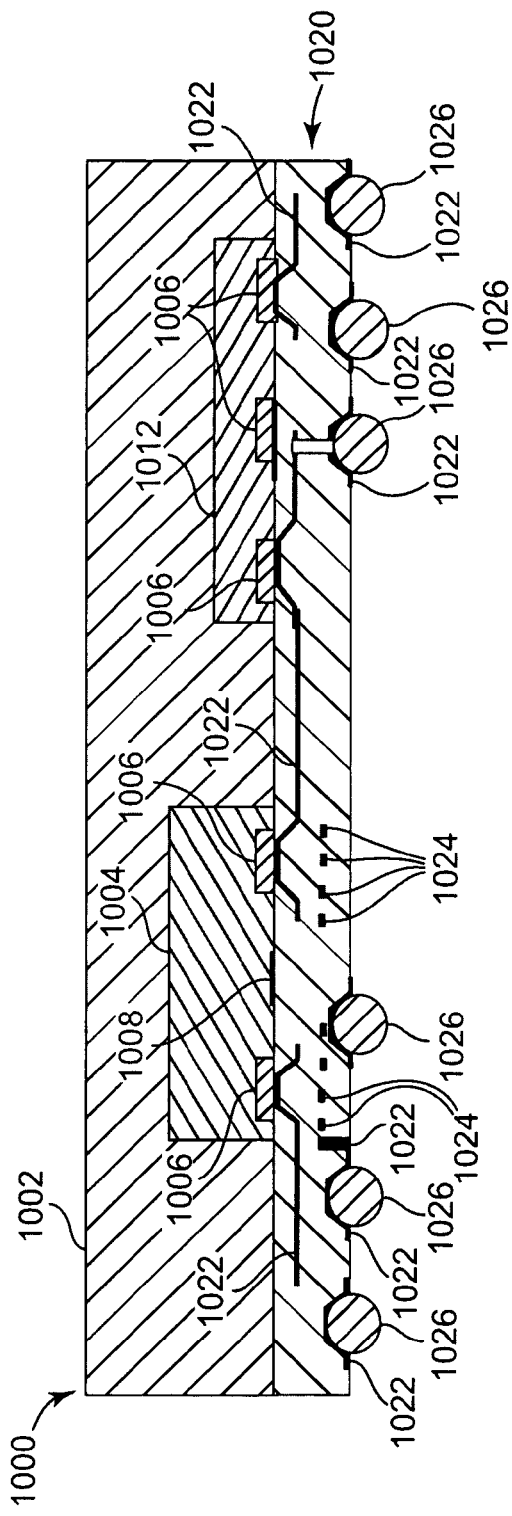
FIG. 10 is a diagram illustrating a cross-sectional view of a multi-chip module including a test conductor coil according to one embodiment.

FIG. 10 is a diagram illustrating a cross-sectional view of a multi-chip module 1000 including a test conductor coil according to one embodiment. The multi-chip module 1000 includes semiconductor die 1004 and 1012 formed on an element 1020, and encapsulated by a mold layer 1002. In one embodiment, element 1020 is a redistribution layer (RDL) structure that includes a plurality of insulation layers and at least one metal layer (e.g., a metal layer sandwiched between two insulation layers), with the individual layers being applied in a sequential manner. In another embodiment, the element 1020 is a laminate that is pre-formed prior to being applied to the die 1004 and 1012. Element 1020 includes a plurality of conductors 1022, which interconnect die pads 1006 on semiconductor die 1004 and 1012 with solder balls 1026. A conductor coil 1024 is also formed in or on element 1020, and is positioned adjacent to a magnetically sensitive element 1008 of semiconductor die 1004.

In one embodiment, the semiconductor die 1004 and 1012 in module 1000 are different types of devices, that perform different functions, and that have different dimensions (e.g., a sensor chip 1004 and a logic chip 1012). In one embodiment, multi-chip module 1000 is formed using the method shown in FIGS. 2A-2H and described above. For multi-chip module 1000, rather than singulating the reconfigured wafer into single-chip modules 220A-220C, as shown in FIG. 2H, the reconfigured wafer is singulated into multi-chip modules, such as module 1000.

Figure 11:
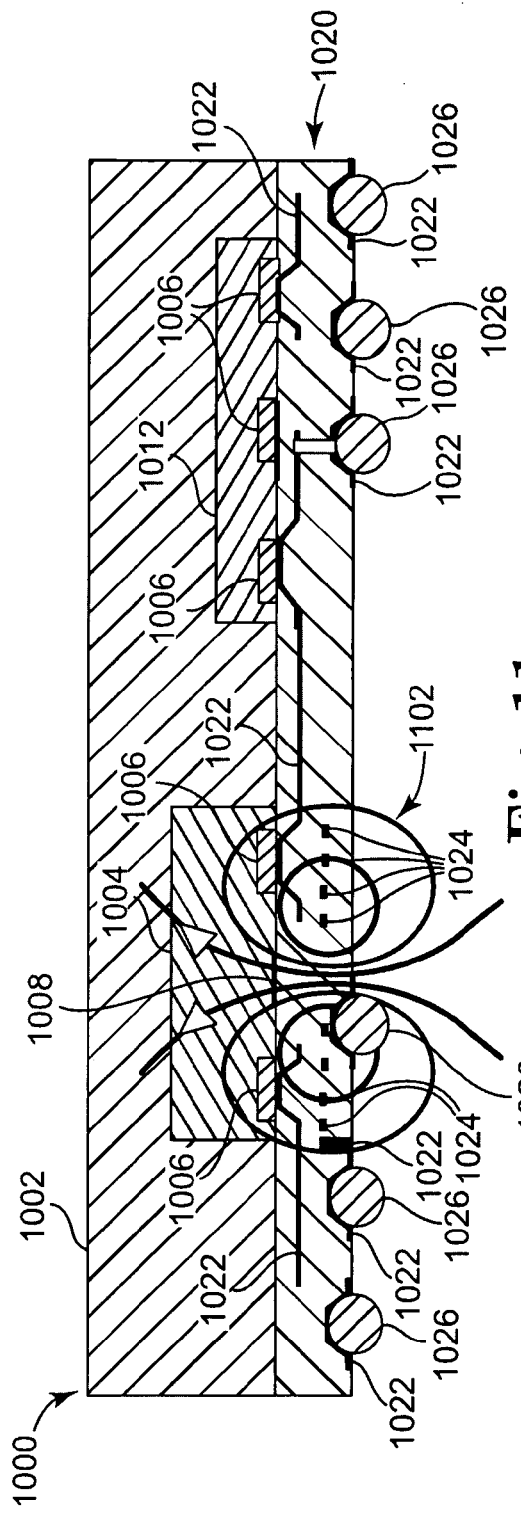
FIG. 11 is a diagram illustrating the multi-chip module shown in FIG. 10 and the generation of a magnetic field with the test conductor coil according to one embodiment.

FIG. 11 is a diagram illustrating the multi-chip module 1000 shown in FIG. 10 and the generation of a magnetic field with the conductor coil 1024 according to one embodiment. As shown in FIG. 11, when a current flows through the conductor 1024, a magnetic field 1102 is generated, which flows through the magnetically sensitive element 1008 in a direction perpendicular to the plane of the magnetically sensitive element 1008.

In operation according to one embodiment, a voltage is applied to, or a current is injected into, a supply solder ball 1022 connected to the conductor coil 1024 during a test mode of the module 1000, causing a current to flow through the conductor coil 1024 to a ground solder ball 1022, which is also connected to the conductor coil 1024. The conductor coil 1024 generates a magnetic field that is applied to the magnetically sensitive element 1008. In one embodiment, the module 1000 processes the signals generated by the magnetically sensitive element 1008 in the test mode in a normal manner (i.e., in the same manner that the signals are processed in a normal mode of operation), and generates corresponding output signals.

In one embodiment, the magnetically sensitive elements (e.g., elements 104, 208A-208C, 404, 506, and 1008) described above are Hall sensor elements. In another embodiment, the magnetically sensitive elements are xMR sensor element (e.g., GMR—giant magneto resistance; AMR—anisotropic magneto resistance; TMR—tunnel magneto resistance; CMR—colossal magneto resistance).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A sensor module comprising:
   a semiconductor die comprising a magnetically sensitive element;
   a plurality of electrical interconnect elements;
   a redistribution layer electrically coupling the plurality of electrical interconnect elements, the magnetically sensitive element, and a conducting coil; and
   a mold layer encapsulating the semiconductor die.

2. The sensor module of claim 1, wherein the semiconductor die comprises a silicon die.

3. The sensor module of claim 1, wherein the magnetically sensitive element comprises a giant magneto resistance (GMR) element.

4. The sensor module of claim 1, wherein the magnetically sensitive element comprises a Hall element.

5. The sensor module of claim 1, wherein the redistribution layer comprises a first polymer layer applied on the semiconductor die; and
wherein the conducting coil is applied over the first polymer layer.

6. The sensor module of claim 5, wherein the redistribution layer comprises a second polymer layer applied over the conducting coil.

7. The sensor module of claim 1, wherein the conducting coil is configured to generate a magnetic field for testing the magnetically sensitive element.

8. The sensor module of claim 1, wherein the redistribution layer comprises a plurality of insulation layers and at least one metal layer.

9. The sensor module of claim 1, wherein at least one of the plurality of electrical interconnect elements is not aligned with the semiconductor die in a direction perpendicular to the semiconductor die.

10. The sensor module of claim 1, wherein each of the plurality of electrical interconnect elements comprises a solder ball.

11. The sensor module of claim 1, wherein the redistribution layer is between the semiconductor die and the plurality of electrical interconnect elements,
wherein the plurality of electrical interconnect elements are electrically coupled to the magnetically sensitive element via die pads of the semiconductor die,
wherein the conducting coil is electrically coupled between at least two of the plurality of electrical interconnect elements, and
wherein the mold layer directly contacts the redistribution layer.

12. A sensor module, comprising:
a first semiconductor die comprising a magnetically sensitive element;
a second semiconductor die;
a plurality of electrical interconnect elements;
a redistribution layer electrically coupling the first semiconductor die to the second semiconductor die and electrically coupling the magnetically sensitive element, the plurality of electrical interconnect elements, and a conductor coil; and
a mold layer encapsulating the first and second semiconductor dies.

13. The sensor module of claim 12, wherein each of the plurality of electrical interconnect elements comprises a solder ball.

14. The sensor module of claim 12, wherein at least one of the plurality of electrical interconnect elements is not aligned with either of the first and second semiconductor dies in a direction perpendicular to the first and second semiconductor dies.

15. The sensor module of claim 12, wherein each of the plurality of electrical interconnect elements comprises a solder ball.

16. A sensor module comprising:
a semiconductor die comprising a magnetically sensitive element;
a plurality of electrical interconnect elements;
a laminate electrically coupling the plurality of electrical interconnect elements, the magnetically sensitive element, and a conducting coil; and
a mold layer encapsulating the semiconductor die.

17. The sensor module of claim 16, wherein the magnetically sensitive element comprises a giant magneto resistance (GMR) element.

18. The sensor module of claim 16, wherein the magnetically sensitive element comprises a Hall element.

19. The sensor module of claim 16, wherein at least one of the plurality of electrical interconnect elements is not aligned with the semiconductor die in a direction perpendicular to the semiconductor die.

20. The sensor module of claim 16, wherein each of the plurality of electrical interconnect elements comprises a solder ball.

* * * * *